(12) United States Patent  
Grisham et al.

(10) Patent No.: US 8,409,946 B2  
(45) Date of Patent: *Apr. 2, 2013

(54) METHODS OF FORMING FIELD EFFECT TRANSISTORS, PLURALITIES OF FIELD EFFECT TRANSISTORS, AND DRAM CIRCUITRY COMPRISING A PLURALITY OF INDIVIDUAL MEMORY CELLS

(75) Inventors: Paul Grisham, Boise, ID (US); Gordon A. Haller, Boise, ID (US); Sahn D. Tang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/528,028

(22) Filed: Jun. 20, 2012

(65) Prior Publication Data

US 2012/0256244 A1 Oct. 11, 2012

Related U.S. Application Data

(63) Continuation of application No. 13/070,256, filed on Mar. 23, 2011, now Pat. No. 8,222,102, which is a continuation of application No. 11/601,478, filed on Nov. 17, 2006, now Pat. No. 7,939,403.

(51) Int. Cl.  
*H01L 21/8236* (2006.01)

(52) U.S. Cl. .................. 438/221; 438/239; 257/E21.646

(58) Field of Classification Search .................. 438/149, 438/164, 221, 238, 253, 396; 257/E21.649, 257/E21.653, E21.646  
See application file for complete search history.

(56) References Cited

U.S. PATENT DOCUMENTS

| 5,466,621 A | 11/1995 | Hisamoto et al. |
| 5,612,230 A | 3/1997 | Yuzurihara et al. |
| 5,801,083 A | 9/1998 | Yu et al. |
| 6,285,057 B1 | 9/2001 | Hopper et al. |
| 6,300,215 B1 | 10/2001 | Shin |
| 6,313,008 B1 | 11/2001 | Leung et al. |
| 6,642,090 B1 | 11/2003 | Fried et al. |

(Continued)

FOREIGN PATENT DOCUMENTS

| DE | 10157785 | 6/2003 |
| EP | 1229579 | 8/2002 |

OTHER PUBLICATIONS

WO PCT/US2006/020877, Aug. 22, 2006, Search Report/Written Opinion.  
WO PCT/US2007/022856, Mar. 19, 2008, Search Report/Written Opinion.

(Continued)

*Primary Examiner* — Brook Kebede  
(74) *Attorney, Agent, or Firm* — Wells St. John, P.S.

(57) ABSTRACT

A method of forming a field effect transistor includes forming trench isolation material within a semiconductor substrate and on opposing sides of a semiconductor material channel region along a length of the channel region. The trench isolation material is formed to comprise opposing insulative projections extending toward one another partially under the channel region along the channel length and with semiconductor material being received over the projections. The trench isolation material is etched to expose opposing sides of the semiconductor material along the channel length. The exposed opposing sides of the semiconductor material are etched along the channel length to form a channel fin projecting upwardly relative to the projections. A gate is formed over a top and opposing sides of the fin along the channel length. Other methods and structures are disclosed.

19 Claims, 12 Drawing Sheets

U.S. PATENT DOCUMENTS

| | | |
|---|---|---|
| 7,407,847 B2 | 8/2008 | Doyle et al. |
| 7,413,955 B2 | 8/2008 | Kim |
| 7,422,960 B2 | 9/2008 | Fischer |
| 7,935,602 B2 | 5/2011 | Wang |
| 7,939,403 B2 * | 5/2011 | Grisham et al. ............... 438/221 |
| 8,222,102 B2 * | 7/2012 | Grisham et al. ............... 438/221 |
| 2004/0110358 A1 | 6/2004 | Lee |
| 2004/0110383 A1 | 6/2004 | Tanaka |
| 2004/0150071 A1 | 8/2004 | Kondo et al. |
| 2004/0195610 A1 | 10/2004 | Morikado |
| 2004/0262687 A1 | 12/2004 | Jung et al. |
| 2005/0136617 A1 | 6/2005 | Jang |
| 2005/0199932 A1 | 9/2005 | Abbott et al. |
| 2005/0250279 A1 | 11/2005 | Son et al. |
| 2006/0046428 A1 | 3/2006 | Baiocco et al. |
| 2006/0076595 A1 | 4/2006 | Wu |
| 2007/0082448 A1 * | 4/2007 | Kim et al. ............... 438/268 |

OTHER PUBLICATIONS

WO PCT/US2007/022856, May 28, 2009, IPRP.

Ananthan, "FinFET—Current Research Issues", School of Electrical and Computer Engineering, Purdue University, Lafayette, Indiana 47907.

Kim et al., "S-RCAT (Spereshaped—Recess—Channel—Array Transistor) Technology for 70nm DRAM feature size and beyond", 2005 Symposium on VLSI Technology Digest, pp. 34-35.

Yeo et al., "80 nm 512M DRAM with Enhanced Data Retention Time Using Partially-Insulated Cell Array Transistor (PiCAT)", 2004 Symposium on VLSI Technology Digest of Technology, 2004 IEEE, pp. 30-31.

* cited by examiner

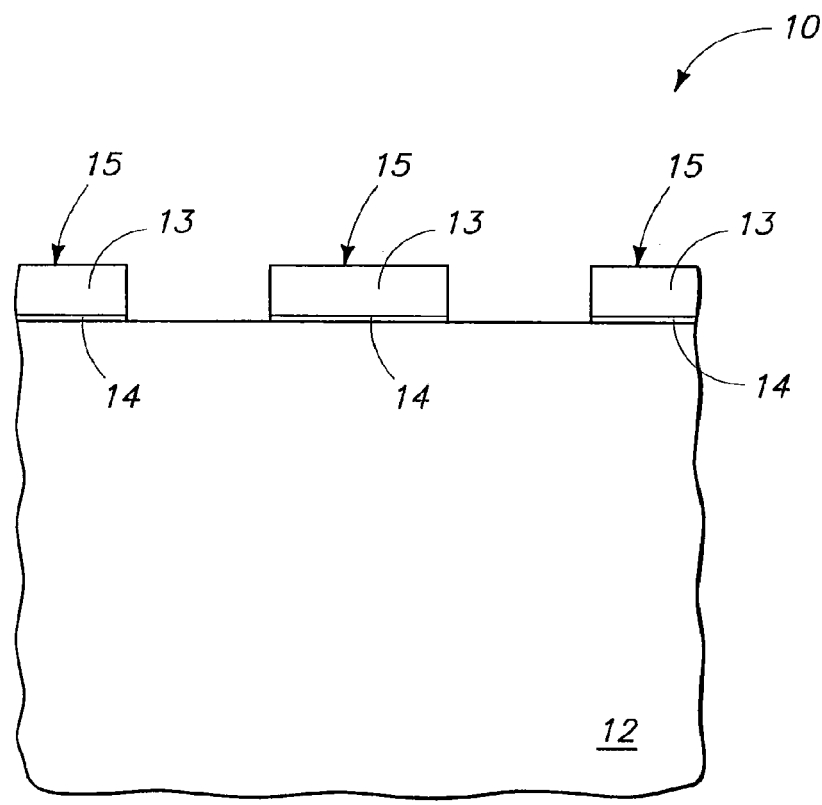
_FIG. 1_
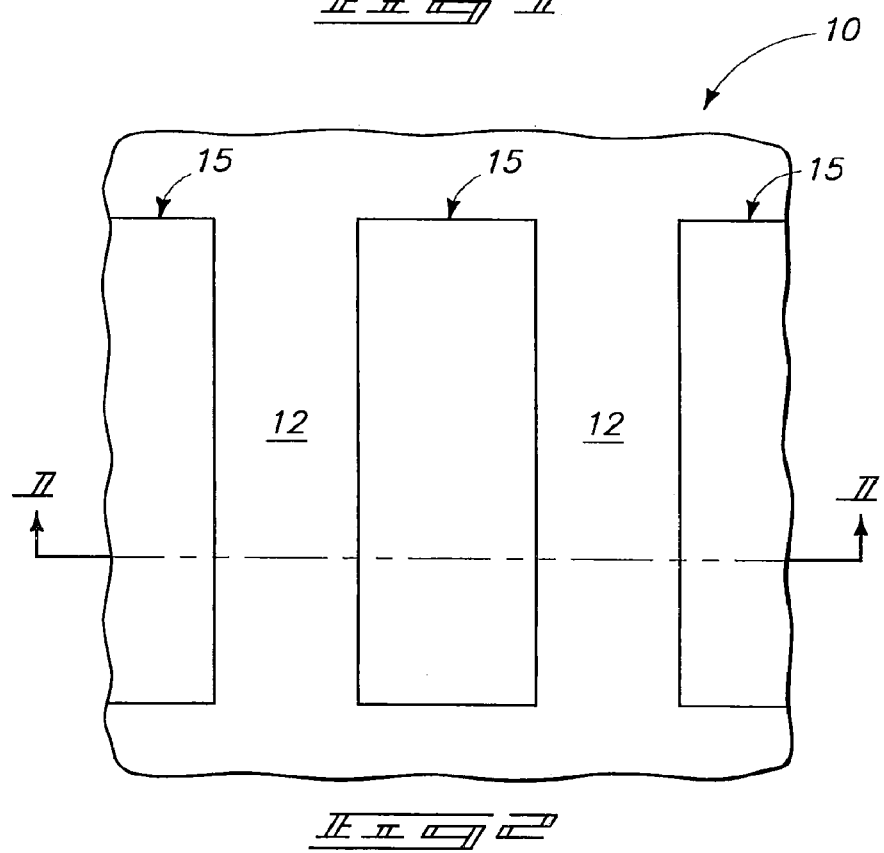
_FIG. 2_

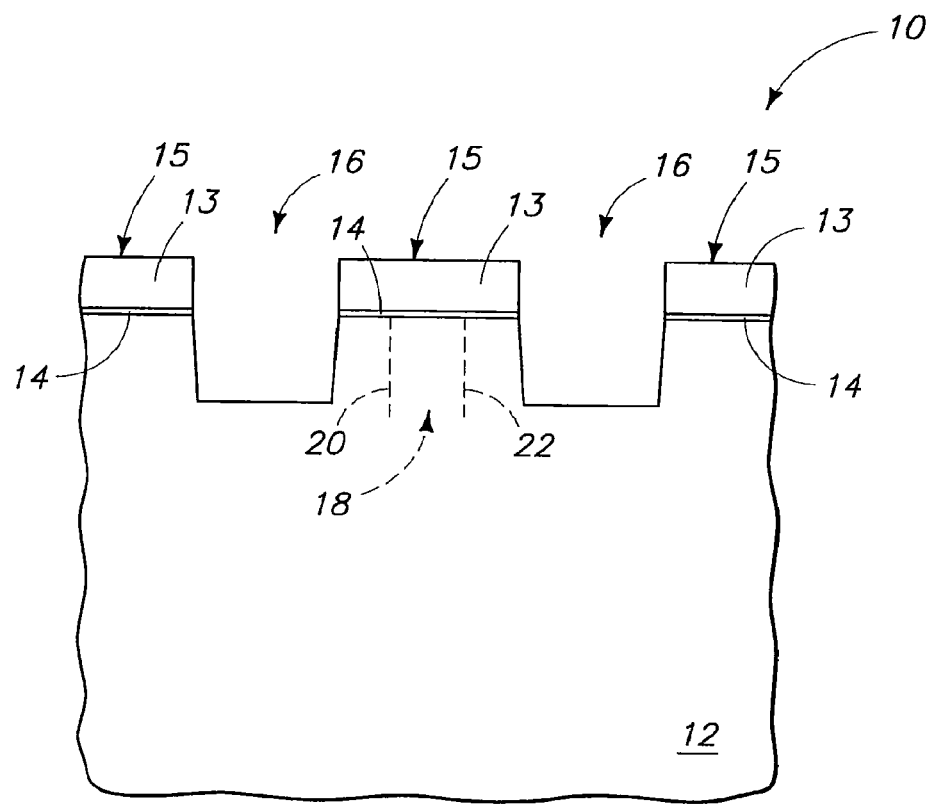
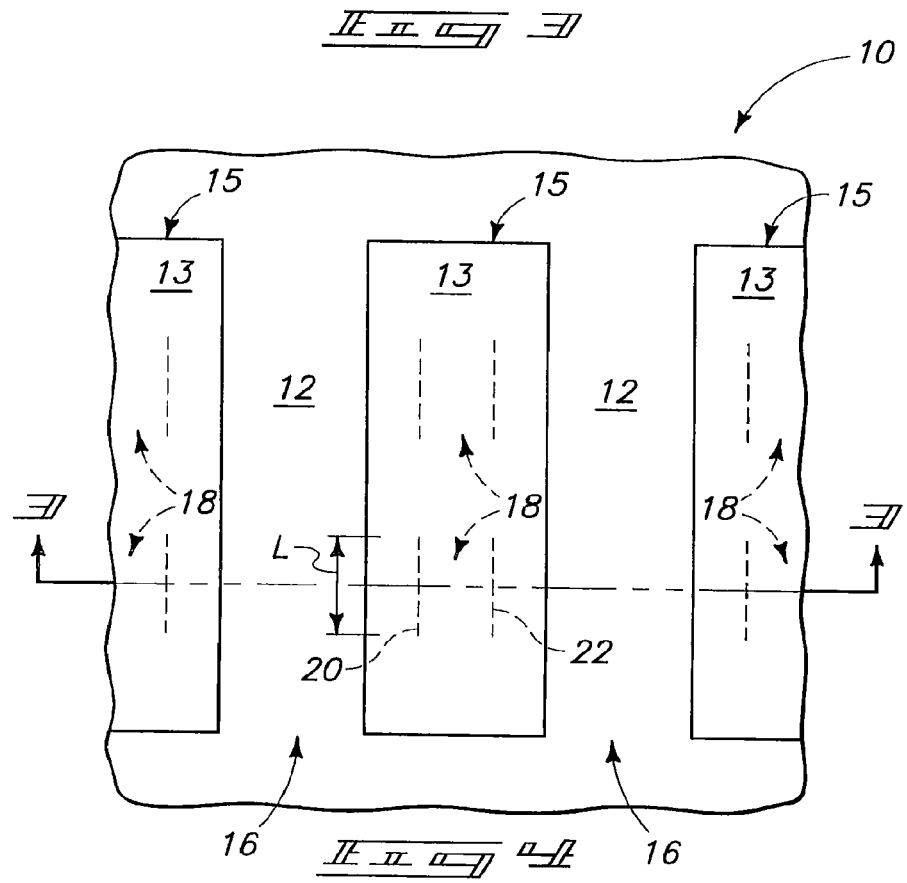

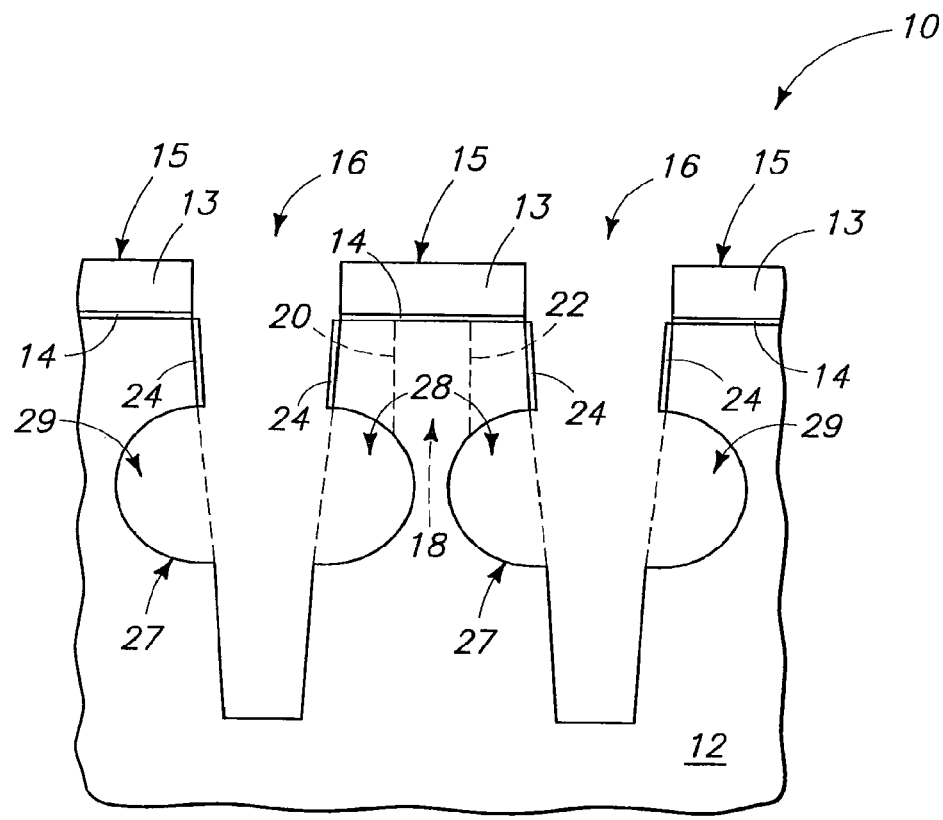
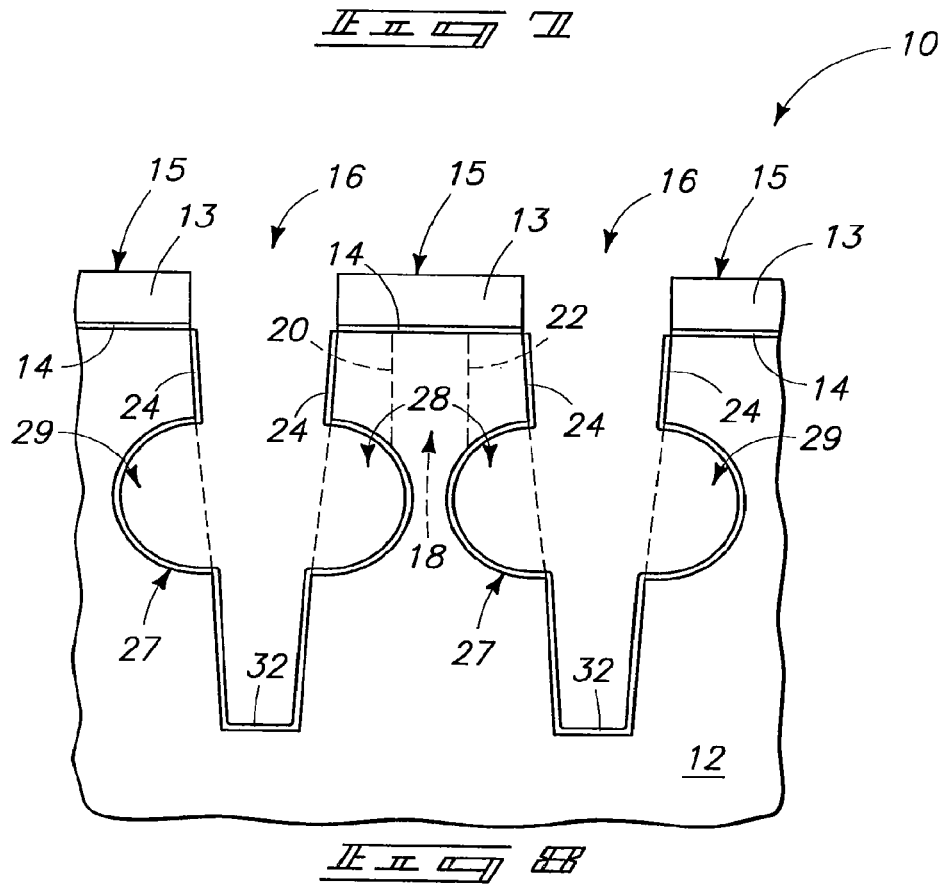

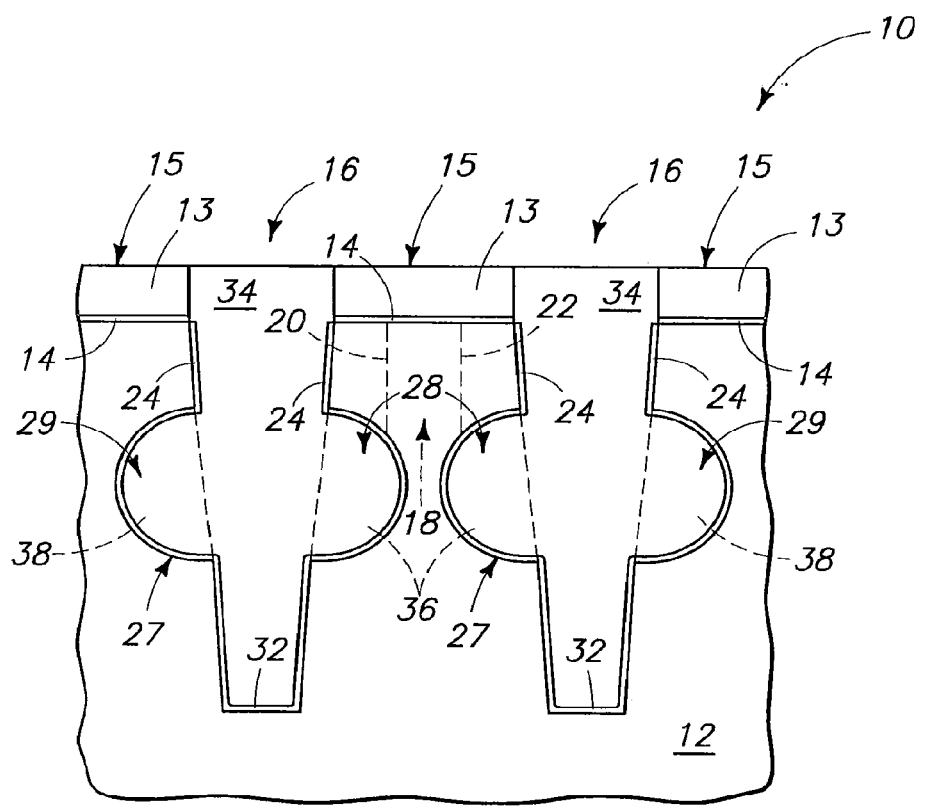
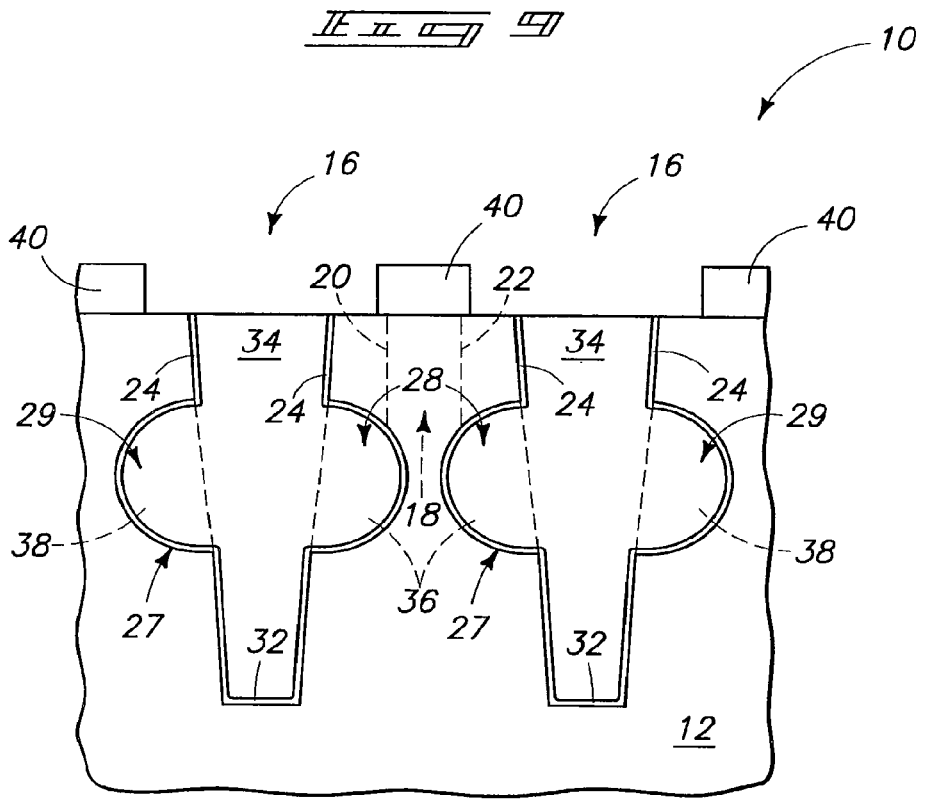

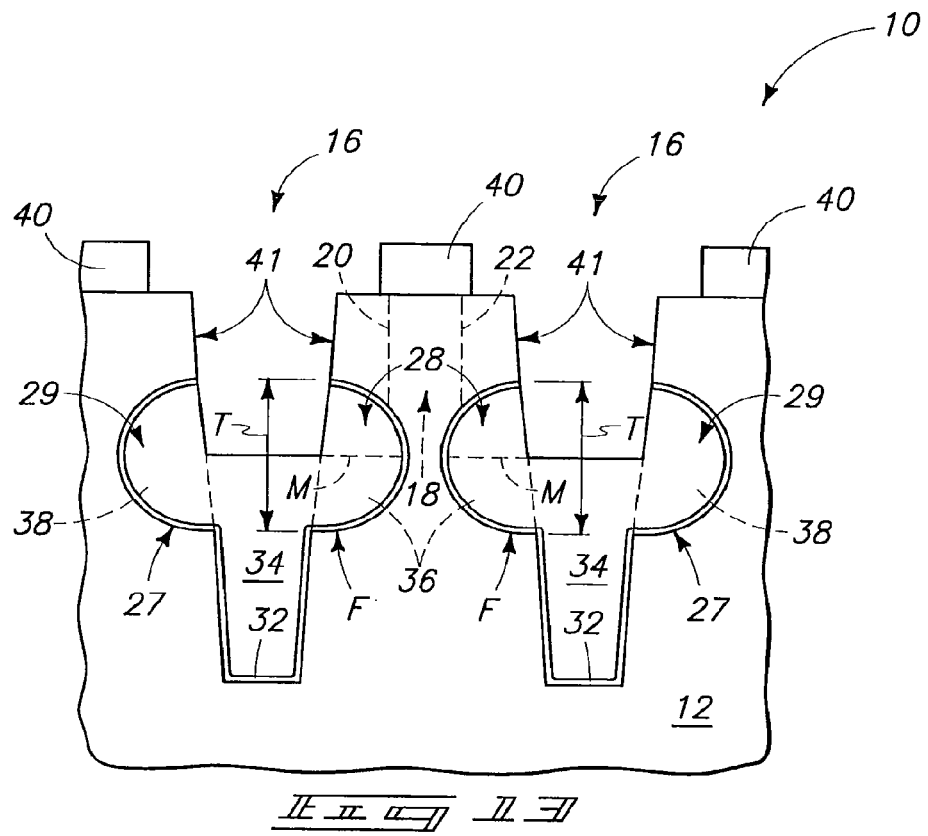
_FIG. 13_
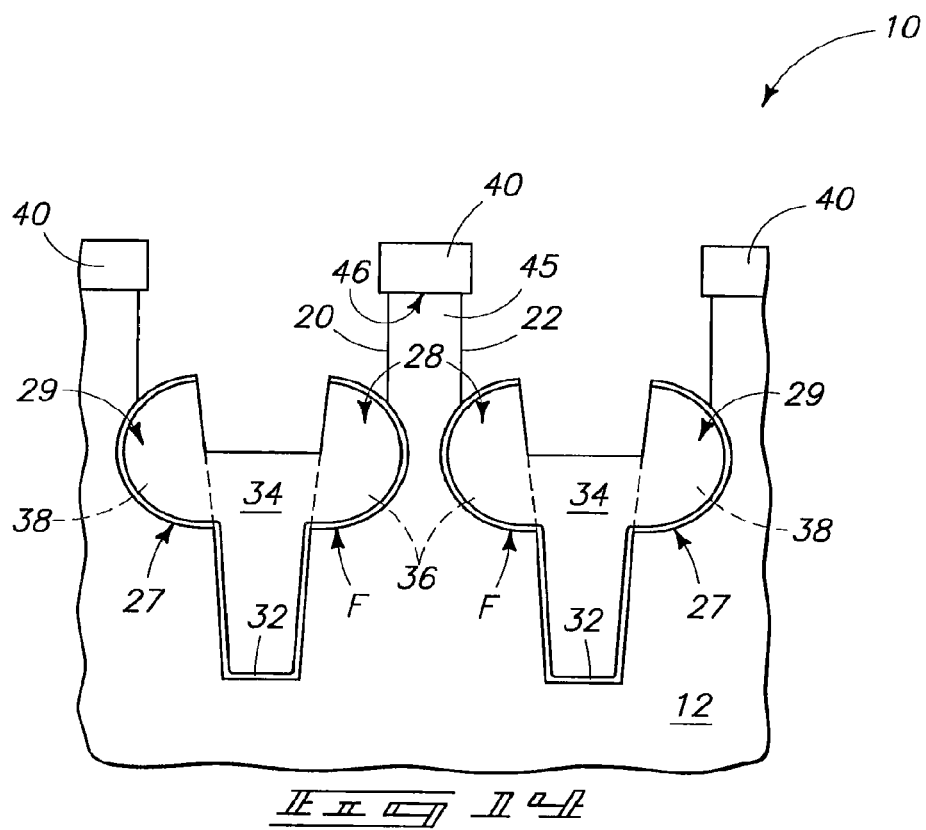
_FIG. 14_

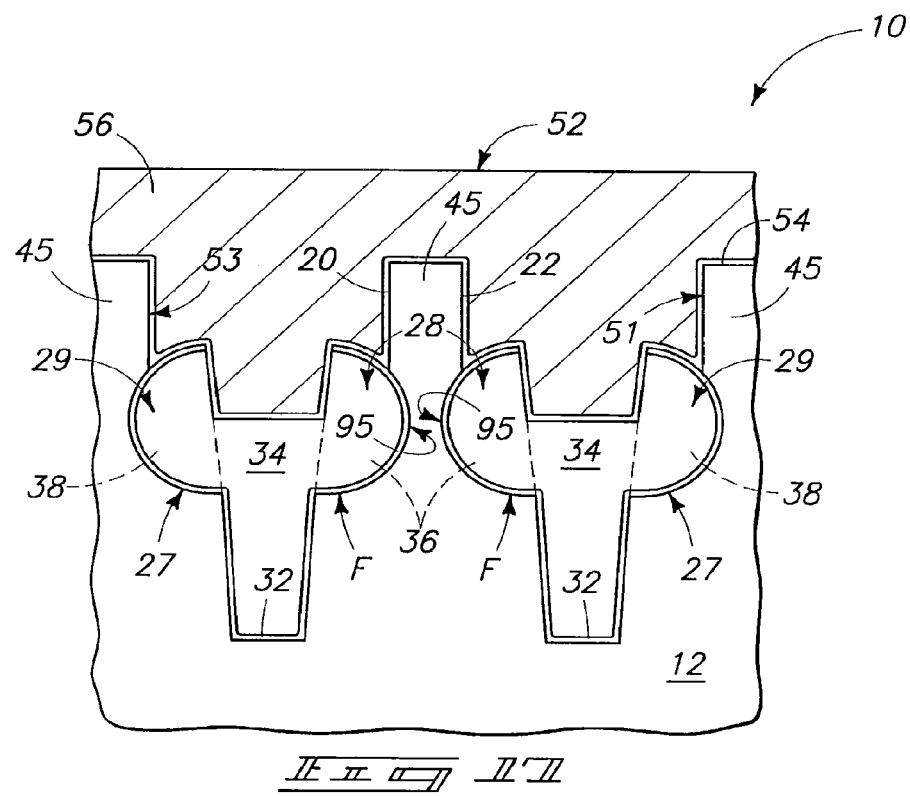
_FIG. 17_
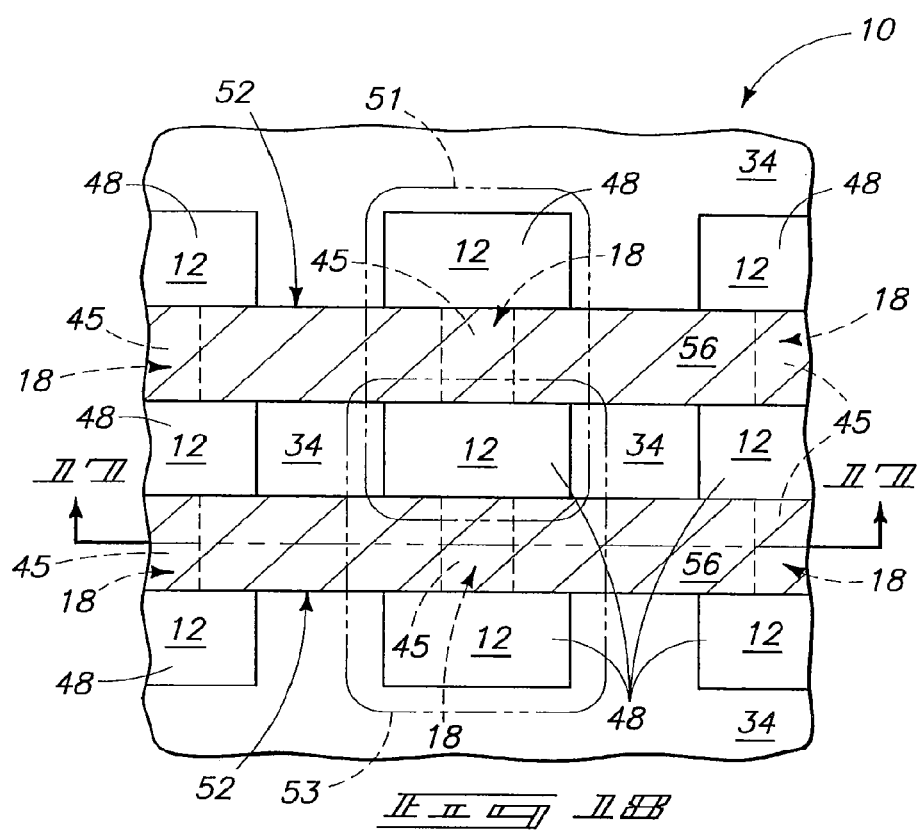
_FIG. 18_

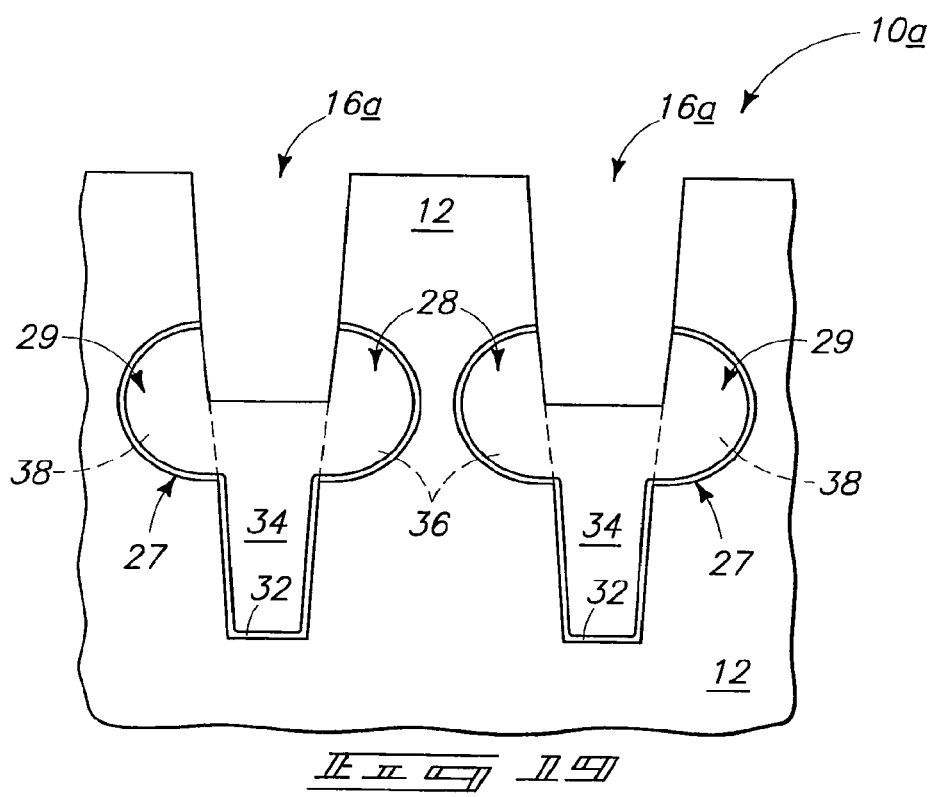
_FIG 19_
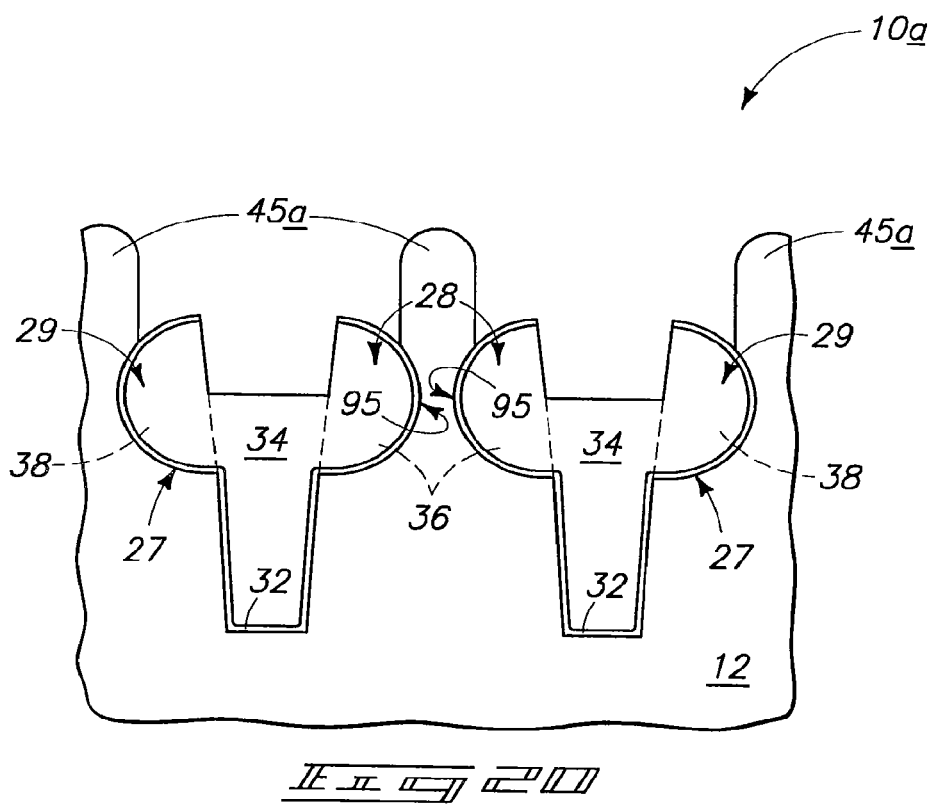
_FIG 20_

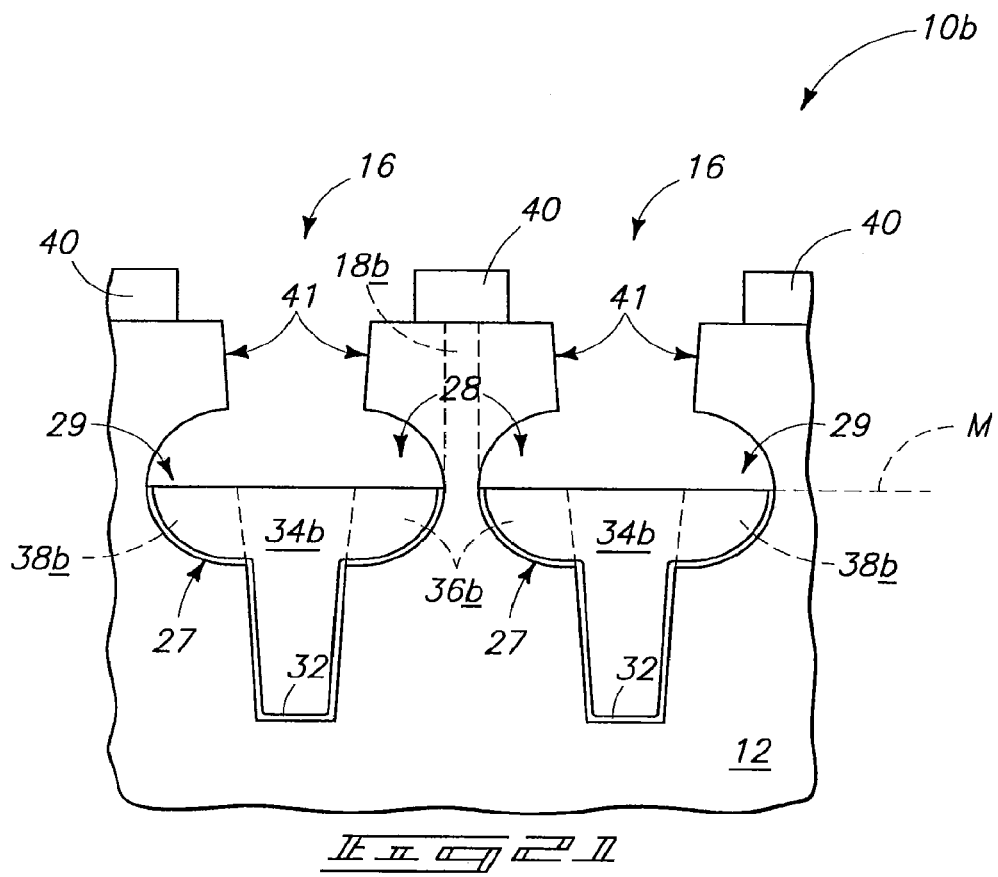
$F \equiv \sqsubseteq \square \square$
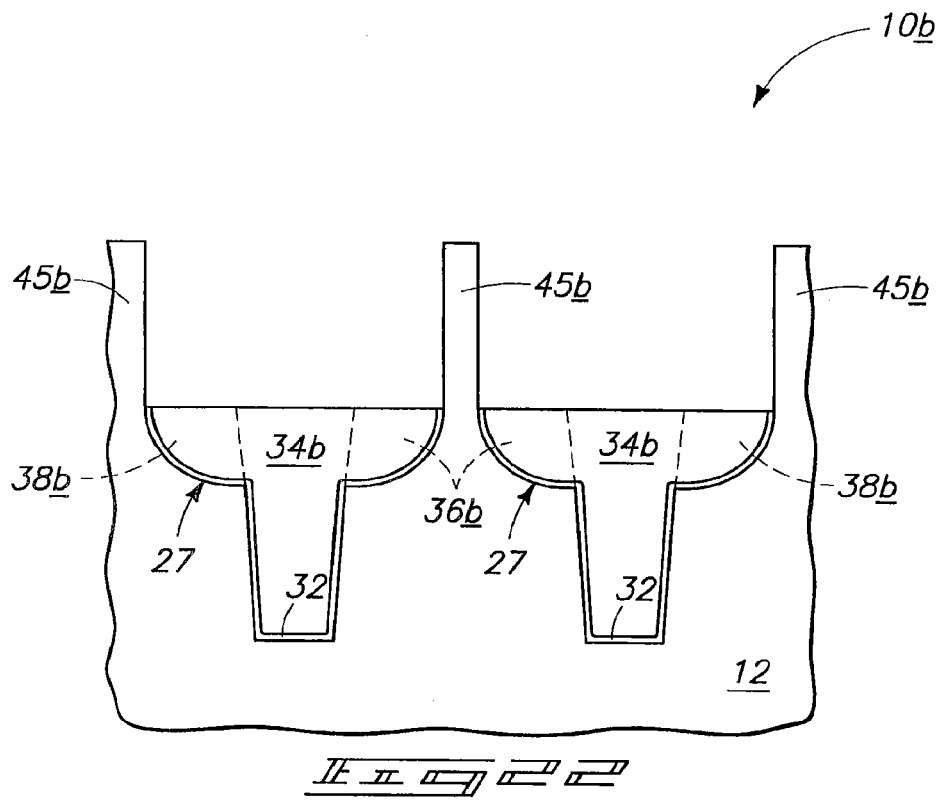
$F \equiv \sqsubseteq \square \square$

METHODS OF FORMING FIELD EFFECT TRANSISTORS, PLURALITIES OF FIELD EFFECT TRANSISTORS, AND DRAM CIRCUITRY COMPRISING A PLURALITY OF INDIVIDUAL MEMORY CELLS

RELATED PATENT DATA

This patent resulted from a continuation application of U.S. patent application Ser. No. 13/070,256, filed Mar. 23, 2011, entitled "Methods of Forming Field Effect Transistors, Pluralities of Field Effect Transistors, and DRAM Circuitry Comprising a Plurality of Individual Memory Cells", naming Paul Grisham, Gordon A. Haller, and Sanh D. Tang as inventors, which is a continuation application of U.S. patent application Ser. No. 11/601,478, filed Nov. 17, 2006, entitled "Methods of Forming Field Effect Transistors, Pluralities of Field Effect Transistors, and DRAM Circuitry Comprising a Plurality of Individual Memory Cells", naming Paul Grisham, Gordon A. Haller, and Sanh D. Tang as inventors, the disclosures of which are incorporated by reference.

TECHNICAL FIELD

Embodiments disclosed herein pertain to methods of forming field effect transistors, to pluralities of field effect transistors, and to DRAM circuitry comprising a plurality of individual memory cells.

BACKGROUND OF THE INVENTION

Field effect transistors are devices commonly used in the fabrication of integrated circuitry. Such devices conventionally comprise a pair of conductive source/drain regions having a semiconductive channel region therebetween. A conductive gate is received operably proximate the channel region, and is separated therefrom by a dielectric material. Application of suitable voltage to the gate causes current to flow from one of the source/drain regions to the other through the channel region, accordingly operating as a switch depending upon voltage application to the gate.

Integrated circuitry fabrication technology continues to strive to make smaller and denser circuits, with the corresponding size of individual devices, of course, shrinking in the process. As the size of field effect transistors gets smaller and the length of the channels between the source/drain regions shortens, complex channel profiles have been developed to achieve desired "on" threshold voltages and to alleviate undesired short channel effects. Such profiles for the channel regions can include gating the channel region from multiple sides. One example such device is a FinFET. Such structures are built on semiconductor-on-insulator substrates in which the semiconductor material (typically silicon) is etched into a "fin"-like shaped channel body of the transistor, with the conductive gate wrapping up and over the "fin".

"Fin"-shaped channel body regions have also been proposed in bulk semiconductor processing in addition to semiconductor-on-insulator processing. Etching of the semiconductor material to produce the typical vertically-extending channel fins can create shoulder areas of semiconductor material adjacent the base of the fins. Such areas can result in undesired parasitic capacitance as the conductive gate is also typically received over these shoulder semiconductor material areas.

BRIEF DESCRIPTION OF THE DRAWINGS

FIG. 1 is a diagrammatic cross section of a substrate fragment at commencement of processing according to an embodiment of the invention, and taken through line 1-1 in FIG. 2.

FIG. 2 is a diagrammatic top plan view of the FIG. 1 substrate fragment.

FIG. 3 is a view of the FIG. 1 substrate fragment at a processing step subsequent to that shown by FIG. 1, and taken through line 3-3 in FIG. 4.

FIG. 4 is diagrammatic top plan view of the FIG. 3 substrate fragment.

FIG. 7 is a view of the FIG. 6 substrate fragment at a processing step subsequent to that shown by FIG. 6.

FIG. 8 is a view of the FIG. 7 substrate fragment at a processing step subsequent to that shown by FIG. 7.

FIG. 9 is a view of the FIG. 8 substrate fragment at a processing step subsequent to that shown by FIG. 8.

FIG. 10 is a view of the FIG. 9 substrate fragment at a processing step subsequent to that shown by FIG. 9, and taken through line 10-10 in FIG. 11.

FIG. 13 is a view of the FIG. 12 substrate fragment at a processing step subsequent to that shown by FIG. 12.

FIG. 14 is a view of the FIG. 13 substrate fragment at a processing step subsequent to that shown by FIG. 13.

FIG. 17 is a view of the FIG. 15 substrate fragment at a processing step subsequent to that shown by FIG. 15, and taken through line 17-17 in FIG. 18.

FIG. 18 is a diagrammatic top plan view of the FIG. 17 substrate fragment.

FIG. 19 is a diagrammatic cross section of another embodiment substrate fragment.

FIG. 20 is a view of the FIG. 19 substrate fragment at a processing step subsequent to that shown by FIG. 19.

FIG. 21 is a diagrammatic cross section of yet another embodiment substrate fragment.

FIG. 22 is a view of the FIG. 21 substrate fragment at a processing step subsequent to that shown by FIG. 21.

DETAILED DESCRIPTION

Figure 5:
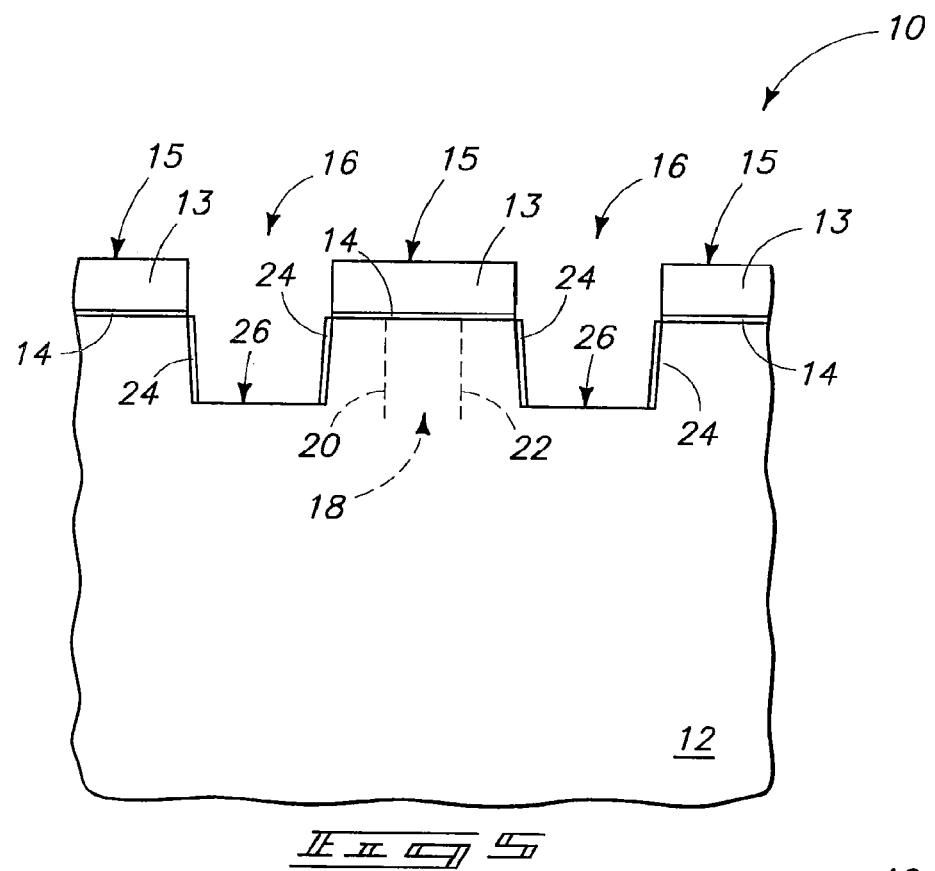
FIG. 5 is a view of the FIG. 3 substrate fragment at a processing step subsequent to that shown by FIG. 3.

Example embodiments of the invention are described in connection with FIGS. 1-24. Referring initially to FIGS. 1 and 2, a semiconductor substrate is indicated generally with reference numeral 10. In the context of this document, the term "semiconductor substrate" or "semiconductive substrate" is defined to mean any construction comprising semiconductor material, including, but not limited to, bulk semiconductor materials such as a semiconductive wafer (either alone or in assemblies comprising other materials thereon), and semiconductor material layers (either alone or in assemblies comprising other materials). The term "substrate" refers to any supporting structure, including, but not limited to, the semiconductive substrates described above. Substrate 10 is depicted as comprising bulk semiconductor substrate material 12, for example monocrystalline silicon. Substrate 12 may, of course, comprise a different substrate, for example including semiconductor-on-insulator substrates and other substrates whether existing or yet-to-be developed.

A field trench isolation mask 15 has been formed and patterned over substrate material 12. In the depicted embodiment, such comprises a pad oxide layer 14 having a silicon nitride-comprising layer 13 formed thereover. Much of the material beneath layers 14 and 13 of field trench isolation mask 15 will constitute active area, while much of the exposed region of mask 15 will constitute trench isolation.

Referring to FIGS. 3 and 4, a pair of trenches 16 has been etched within semiconductor substrate 10 into semiconductor material 12. An example etch depth for trenches 16 is from 800 to 1,000 Angstroms. For purposes of the continuing discussion, semiconductor material 12 may be considered as comprising a semiconductor material channel region 18 comprising opposing sides 20 and 22 extending along a length "L" of the channel region 18. Accordingly, trenches 16 are formed on opposing sides 20, 22 of semiconductor material channel region 18 along channel length L. Substrate 10 would typically, of course, comprise more masked regions 15, and a series of such trenches 16 would likely be etched over substrate 10. An example dry anisotropic etching chemistry to produce the FIGS. 3 and 4 construction includes a combination of HBr and $Cl_2$.

Referring to FIG. 5, trenches 16 have been lined with one or more suitable masking materials 24, and which has been subsequently anisotropically etched to expose a semiconductor material base 26 of substrate material 12. An example material 24 is silicon nitride formed by chemical vapor deposition and/or by plasma or other nitridation of semiconductor material 12. An example lateral thickness of material 24 is from 60 Angstroms to 90 Angstroms. Accordingly, such provide but one example manner by which trenches 16 can be formed to have lined sidewalls and an exposed semiconductor material base 26.

Figure 6:
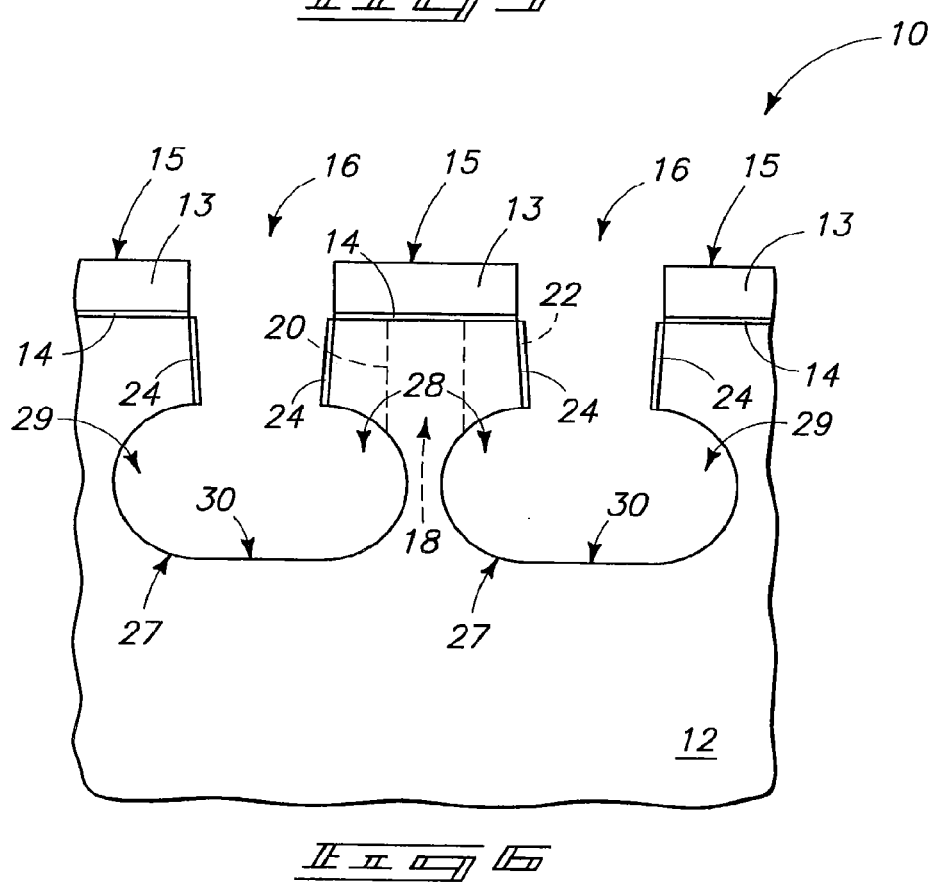
FIG. 6 is a view of the FIG. 5 substrate fragment at a processing step subsequent to that shown by FIG. 5.

Referring to FIG. 6, semiconductor material bases 26 (not shown) have been substantially isotropically etched through effective to form a bulbous lower portion 27 of each trench 16. Each of bulbous lower portions 27 comprises projections 28, 29 extending laterally outward relative to the lined trench sidewalls referred to above. One projection of each bulbous lower portion 27 opposes and extends towards a projection of the other bulbous lower portion, with the projections that have been designated with numeral 28 being shown as constituting such example opposing projections. For purposes of the continuing discussion, bulbous lower portions 27 may be considered as comprising respective floors 30. Where semiconductor material 12 comprises monocrystalline silicon, an example isotropic etching chemistry to produce the depicted bulbous lower portions includes a dry etching chemistry using HBr and $NF_3$. An example added depth to trenches 16 beyond the depth shown by the FIG. 3 etch is from 800 to 1,000 Angstroms.

Referring to FIG. 7, substantially anisotropic etching has been conducted through floors 30 of bulbous lower portions 27 to extend pair of trenches 16 deeper within semiconductor substrate 10. An example added depth for the depicted lower stem portions of such trenches is from 500 to 1,000 Angstroms. Most desirably, the etch chemistry and parameters are switched back to anisotropic in situ.

Referring to FIG. 8, trenches 16 have been lined with one or more suitable materials 32, for example one or more layers of silicon dioxide and/or silicon nitride. Such might be deposited by one or both of chemical vapor deposition and/or thermal/plasma nitridation and/or oxidation of the sidewalls of the depicted trenches. An example thickness for layer 32 is from 50 to 150 Angstroms.

Referring to FIG. 9, one or more insulative materials 34 have been deposited effective to fill remaining volume of trenches 16 with insulative material. Material 34 is also depicted as being planarized back at least to the outer portion of silicon nitride layer 13. Alternatively and by way of example only, trench isolation masking layer 13 (and also perhaps layer 14) may be removed from the substrate prior to deposition of insulative material 34. Regardless, an example material 34 is high plasma density deposited silicon dioxide.

Such provides but one example method of forming trench isolation material 34 within a semiconductor substrate 12 and on opposing sides 20, 22 of a semiconductor material channel region 18 along a length L of the channel region. Trench isolation material 34/32 can be considered as comprising opposing insulative projections 36 which extend toward one another along channel length L, and insulative projections 38. In one embodiment, semiconductor material 12 of substrate 10 is received over/atop insulative projections 36, as shown. In one embodiment, insulative projections 36 are received partially under channel region 18, as shown.

Figure 11:
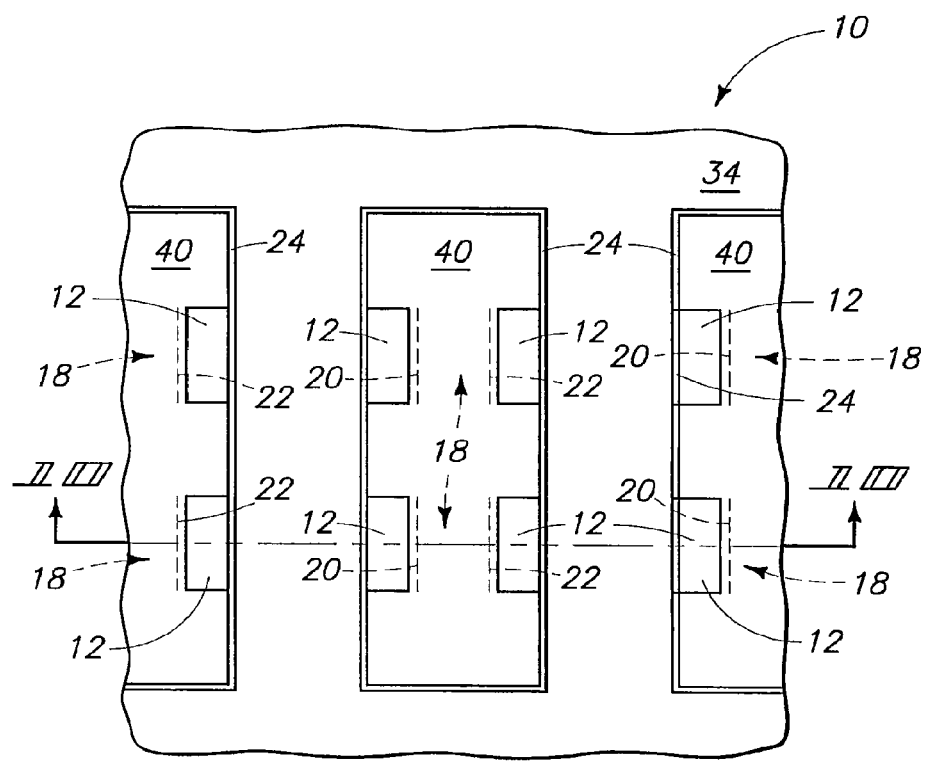
FIG. 11 is a diagrammatic top plan view of the FIG. 10 substrate fragment.

As referred to above, trench isolation masking material 13 may be removed from the substrate prior to or after the formation of trench isolation material 34. Regardless, preferably substrate 10 at this point will be patterned for ultimate desired formation of fin channel features while protecting the cell contact, bit contact, and field trench isolation regions of the structure. Such might be accomplished in any number of manners, with FIGS. 10 and 11 illustrating but one embodiment of such masking and patterning. FIGS. 10 and 11 depict materials 13 and 14 having been removed, and insulative material 34 having been etched back. One or more masking materials 40 have been deposited and patterned primarily for the fabrication of fin-channel regions. Material 40 patterned over channel regions 18 will not necessarily be patterned to conform to the outline of channel regions 18 (as shown). Further, such may be patterned to essentially cover all (not shown) of the semiconductor material between trench isolation material 34/32 in the FIG. 10 cross-section. Alternatively and by way of example only, and as will be subsequently described in connection with another embodiment, all of such semiconductor material in the FIG. 10 cross-section between trench isolation material 34 may be outwardly exposed, and thereby not masked by material 40. An example preferred material 40 is silicon nitride deposited to an example thickness range of from 600 to 1,200 Angstroms.

Figure 12:
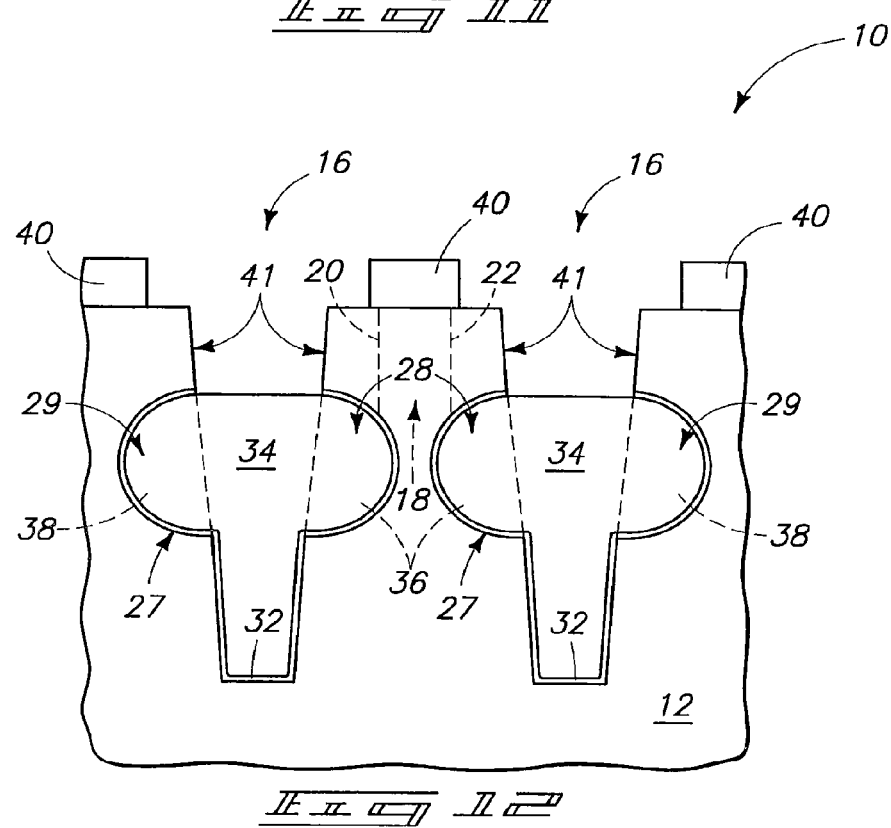
FIG. 12 is a view of the FIG. 10 substrate fragment at a processing step subsequent to that shown by FIG. 10.

Referring to FIG. 12, trench isolation material 34 has been etched to expose opposing sides 41 of semiconductor material 12 along channel length L. Such etching might be isotropic, anisotropic, or a combination of one or more of anisotropic and isotropic etching steps. Where trench isolation material 34 comprises high density plasma deposited silicon dioxide, an example anisotropic dry etching chemistry comprises a combination of $C_4F_6$, $C_4F_8$, $O_2$, He, and Ar, whereas an example isotropic wet etching chemistry comprises a buffered aqueous HF solution. Where a lining 24 remains from the example preferred FIG. 5 processing, and where such comprises silicon nitride, such is also etched (as shown) and an example silicon nitride etching chemistry to expose semiconductor material sidewalls 41 comprises a combination of $CH_2F_2$ and $O_2$.

FIG. 12 illustrates the etching of trench isolation material 34 being conducted at least elevationally to opposing insulative projections 36, which is preferred. FIG. 13 illustrates an example of continuing the FIG. 12 etching in a dry, substantially anisotropic manner into trench isolation material 34 which is laterally adjacent the trench insulative material 34/32 of opposing insulative projections 36. In one embodiment and as shown, such etching of trench isolation material 34/32 is depicted as not being into any insulative material 34/32 within the opposing insulative projections 36, although other embodiments are of course contemplated, for example as will be described below. Further in one embodiment and as depicted in FIG. 13, opposing insulative projections 36 can be considered as having some elevational thickness "T" having an elevational mid-point "M", and having floors "F". Etching of trench isolation material 34, as shown in FIG. 13, has been at least to mid-point M of elevational thickness T, and is precisely thereat. The etching of trench isolation 34 and 32, however, is desirably not conducted all the way to floors F.

Referring to FIG. 14, exposed opposing sides 41 (not shown due to their removal) of semiconductor material 12 have been etched along channel length L to form a channel fin 45. In the depicted example FIG. 14 embodiment, such is projecting upwardly, preferably relative to opposing insulative projections 36. For purposes of the continuing discussion, semiconductor material 12 along channel length L can be considered as having a top 46, with such top 46 being masked during etching of the exposed opposing sides of semiconductor material 12 to form channel fin 45, and with such masking occurring by way of example only from material 40. Another embodiment is described below whereby example top 46 is unmasked during the semiconductor material etching to form channel fin 45. Regardless, etching of semiconductor material 12 to form projecting channel fin 45 may desirably be conducted in a substantially anisotropic manner, with an example of an etching chemistry to produce to the FIG. 14 construction comprising starting with a combination of $CF_4$ and He, and finishing with HBr.

Figure 15:
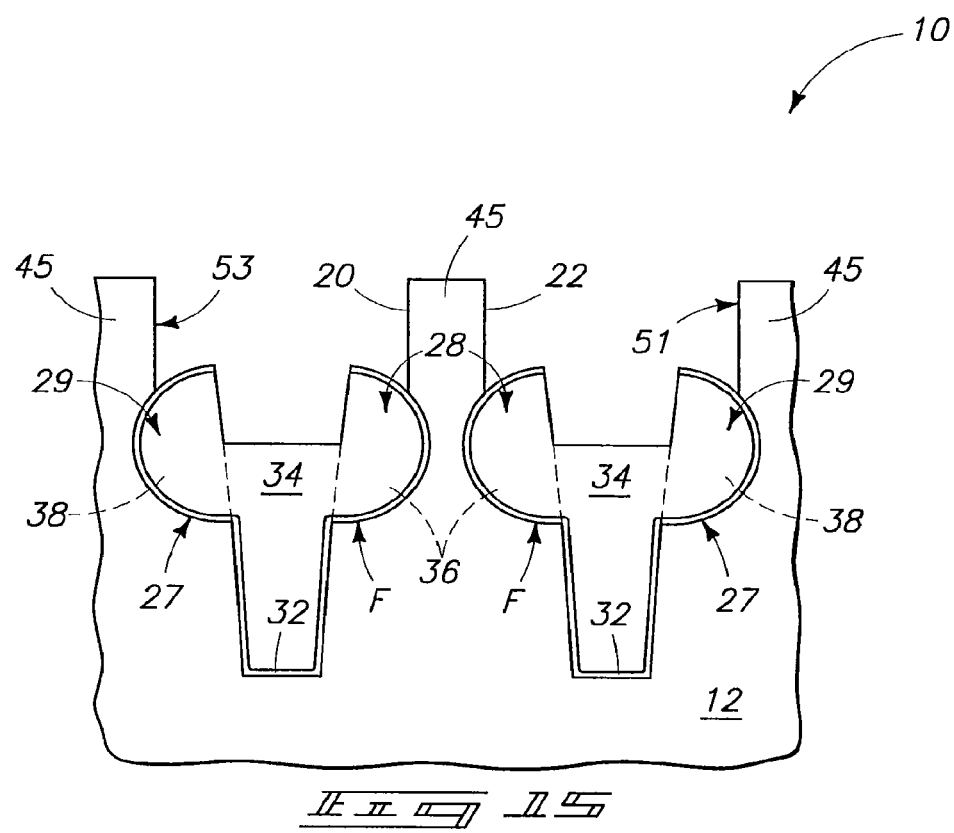
FIG. 15 is a view of the FIG. 14 substrate fragment at a processing step subsequent to that shown by FIG. 14, and taken through line 15-15 in FIG. 16.
Figure 16:
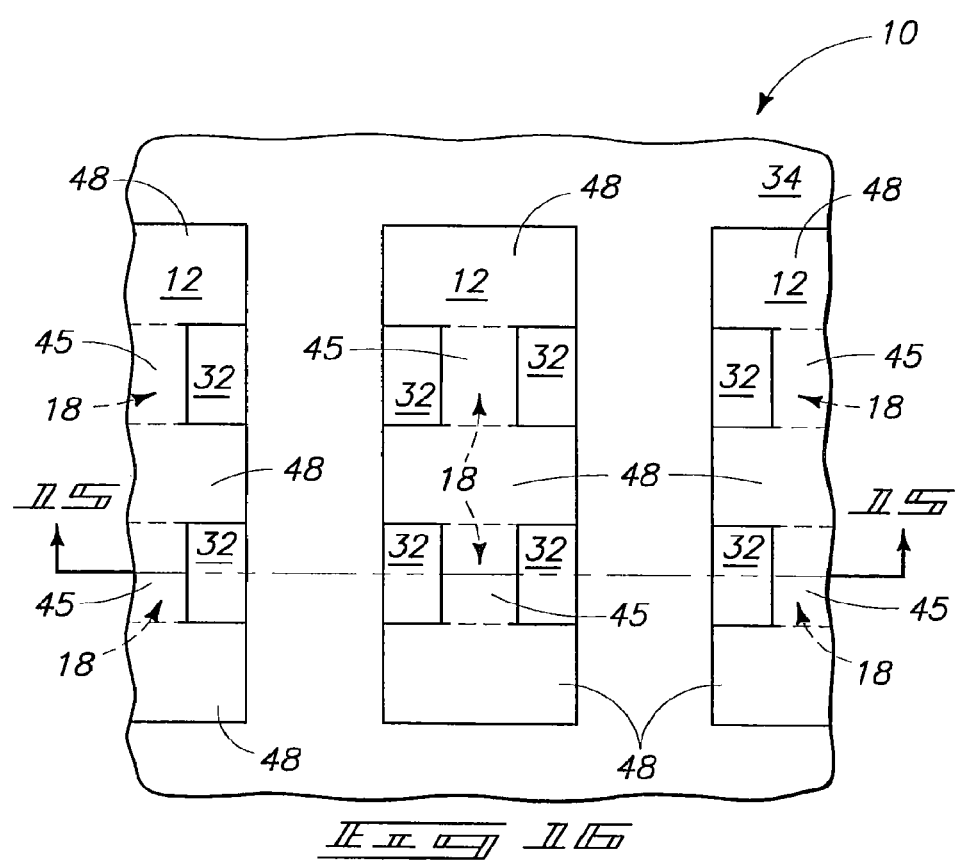
FIG. 16 is a diagrammatic top plan view of the FIG. 15 substrate fragment.

Referring to FIGS. 15 and 16, an example of subsequent processing is shown whereby masking material 40 has been removed. Outlines 48 are shown that comprise transistor source/drain regions that have or will be fabricated and that connect with a fin channel region 45.

Referring to FIGS. 17 and 18, a gate 52 has been formed over a top and opposing sides 20, 22 of fin channel region 45 along channel length L. Such is depicted as being formed by forming a gate dielectric layer 54, followed by the deposition of one or more conductive layers 56 (including one or more conductively doped semiconductor layers), and patterning of at least conductive material 56 into line-shaped configurations 52, for example as shown in FIG. 18. Source/drain doping and/or construction may be subsequently finalized, or may have been essentially completed previously to form source/drains 48. For example, FIG. 18 depicts two transistors 51 and 53 having been fabricated, and which by way of example share a source/drain region 48 between the depicted gate lines 52.

The above-described embodiment masked the top of the semiconductor material along the channel length during etching of the exposed opposing sides of the semiconductor material to form the channel fin. By way of example only, another embodiment is shown in FIGS. 19 and 20 with respect to a substrate fragment 10a. Like numerals from the first-described embodiment have been utilized where appropriate, with differences being indicated with the suffix "a". FIG. 19 is analogous to the FIG. 13 substrate depiction; however, where masking material 40 of FIG. 13 has been removed from/is not provided over what will be the fin channel region. Further, a greater quantity of semiconductor material 12 has been provided above opposing insulative projections 36.

Referring to FIG. 20, exposed opposing sides of semiconductor material 12 have been etched along channel length L to form an upwardly projecting channel fin 45a. Accordingly in the depicted FIGS. 19 and 20 example, the top of material 12 along channel length L is unmasked during the etching of the exposed opposing sides of semiconductor material 12 to form the channel fin, and the etching of such top desirably occurs during the etching of the exposed opposing sides to form the channel fin. A combination of isotropic and anisotropic etches might be conducted in lieu of the foregoing. Regardless, gates (not shown) may be fabricated subsequently, analogous to that shown in FIGS. 17 and 18.

Figure 23:
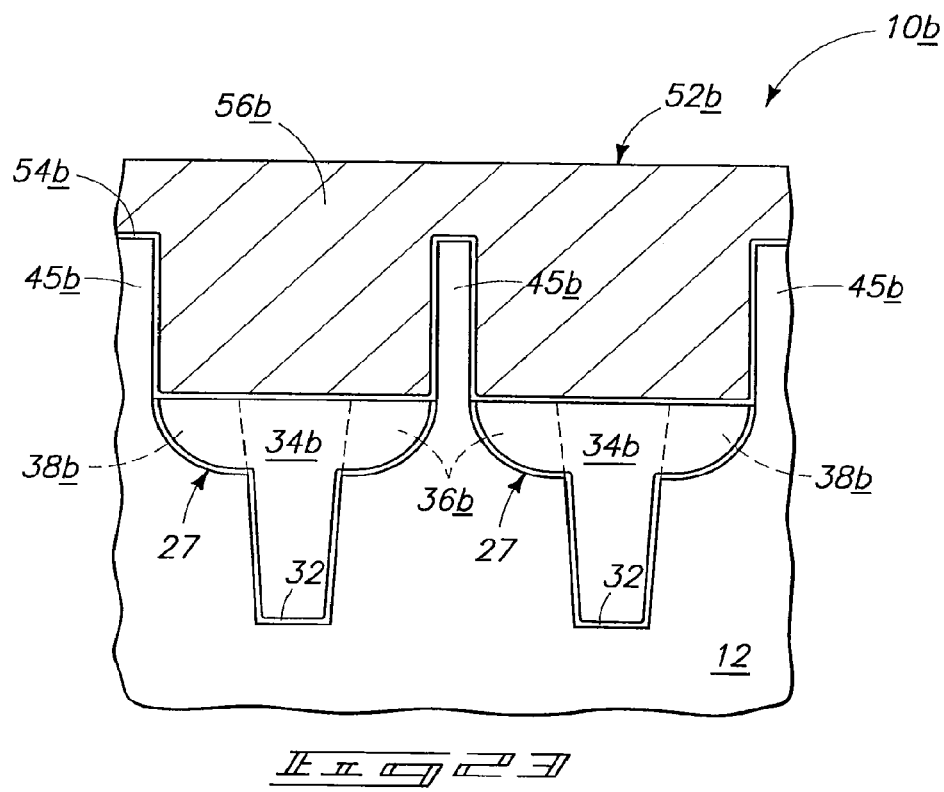
FIG. 23 is a view of the FIG. 22 substrate fragment at a processing step subsequent to that shown by FIG. 22.

Another embodiment is shown in FIGS. 21-23 with respect to a substrate fragment 10b. Like numerals from the first-described embodiment have been utilized where appropriate, with differences being indicated with the suffix "b". FIG. 21 essentially depicts processing subsequent to or continuing of that shown by the first embodiment substrate of FIG. 12. FIG. 13 depicted the etching of trench isolation material 34 in a manner which was not into any insulative material within opposing insulative projections 36. Etching however may also, of course, occur into insulative projections 36 in connection with the above-identified substrates 10 and 10a embodiments. By way of example only, FIG. 21 depicts an embodiment wherein at least some of trench isolation material 34/32 is etched from opposing insulative projections 36 to form projections 36b and 38b. FIG. 21 illustrates substantially isotropic etching of trench isolation material 34/32 and within projections 36 to elevational mid-point M. An example isotropic etching chemistry to remove material 34 includes an aqueous buffered HF solution. An isotropic etching chemistry to remove material 24 and 32, where such comprise silicon nitride, includes a combination of $CH_2F_2$ and $O_2$.

FIG. 22 depicts subsequent etching of the exposed opposing sides of semiconductor material 12 along channel length L to form an upwardly projecting channel fin 45b. FIG. 23 depicts subsequent processing for the fabrication of a gate 52b, including conductive material 56b and gate dielectric 54b.

The above substrates 10 and 10a provide embodiments whereby insulative material 34/32 within each of opposing projections 36 is at least partially received under upwardly projecting fin 45. Further, the substrates 10 and 10a embodiments depict substrates having insulative projection inner surfaces 95 (FIGS. 17 and 20) extending along the length of the channel which are convexly curved relative to the fin thickness transverse the channel length. The FIG. 22 embodiment depicts one example field effect transistor wherein none of insulative material 34/32 within each of opposing projections 36b in the finished construction is received under upwardly projecting channel fin 45b.

The above-described processing is particularly desirable wherein the etching of some of the trench isolation material occurs from opposing insulative projections prior to etching the exposed opposing sides of the semiconductor material to form the channel fin. Embodiments of the invention also contemplate conducting at least some of the etching of the trench isolation material from the opposing insulative projection commensurate with the etching of the exposed opposing sides of the semiconductor material to form the channel fin. By way of example only, a single substantially anisotropic etching chemistry may be utilized to directly go from the FIG. 10 depiction to produce the FIG. 22 construction.

Some embodiments of the invention, of course, encompass methods of forming one or more field effect transistors by the above-described methods. Some embodiments of the invention also contemplate a plurality of field effect transistors independent of the method of fabrication. By way of example only, one embodiment contemplates a plurality of field effect transistors wherein individual of such transistors comprise a semiconductor substrate comprising a pair of source/drain regions having a fin channel region received therebetween. The fin channel region comprises a channel length extending between the pair of source/drain regions, opposing channel sides extending along the length of the channel region, and a top extending along the length of the channel region. The fin channel region has a maximum thickness transverse the channel length.

A gate is received over the fin channel top and the channel sides along the channel length. Insulative material is received immediately beneath the fin channel region extending along the channel length, and extends only partially across the fin channel maximum thickness transverse the channel length. The insulative material includes opposing portions projecting inwardly toward one another under the fin channel region relative to the fin channel maximum thickness along the channel length. By way of example only, an individual of such field effect transistors is shown with respect to the embodiments exemplified by FIGS. 17, 18 and 20 above. Desirable sizes and materials of construction and configurations may otherwise be as described above.

An embodiment of the invention encompasses a plurality of field effect transistors wherein individual of such transistors comprise a bulk semiconductor substrate comprising a pair of source/drain regions having a fin channel region received therebetween. The fin channel region comprises a channel length extending between the pair of source/drain regions, opposing channel sides extending along the length of the channel region, and a top extending along the length of the channel region.

A gate is received over the fin channel top and the channel sides along the channel length. Trench isolation is received within the bulk semiconductor substrate elevationally lower than the fin channel region and extends along the opposing channel sides along the channel length. The trench isolation in cross-section transverse the channel length comprises a lower trench stem and upper transverse projections extending from the stem transversely towards and elevationally lower than the fin channel. Each of the above embodiments depict such an example individual field effect transistor channel region, wherein the lower portion of the trench etched below the bulbous portion can be considered as a lower trench stem having upper transverse projections encompassed by projections 36/36b.

Figure 24:
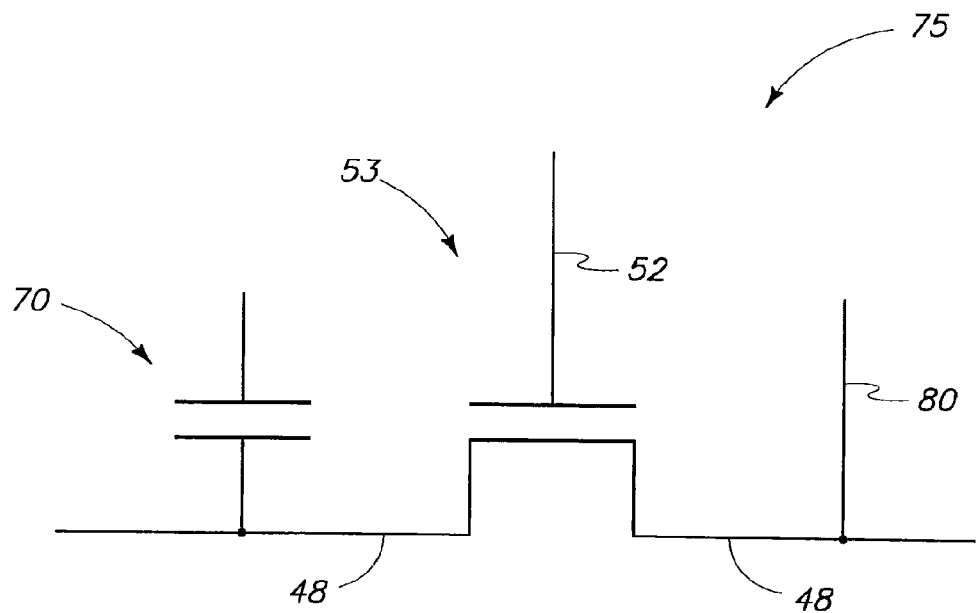
FIG. 24 is a schematic representation of DRAM circuitry.

Embodiments of the invention also encompass DRAM circuitry comprising a plurality of individual memory cells. Individual of the memory cells comprise a field effect transistor having a pair of source/drain regions, a capacitor connected with one of the source/drain regions, and a bit line contact connected with another of the source/drain regions. For example, FIG. 24 depicts an example such DRAM memory cell 75 encompassing a transistor 53 (i.e., transistor 53 of FIG. 18). A capacitor 70 is connected with one of source/drain regions 48 and a bit line contact 80 connected with another of source/drain regions 48. For example, bit line contact 80 would connect with source/drain region 48 shown in FIG. 18 between the depicted gate lines 52 of transistor 73 with a bit line, and the lower-depicted source/drain region 48 of transistor 53 in FIG. 18 would connect with an appropriate capacitor 70.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention clamed is:

1. A method of forming a field effect transistor, comprising:
    forming trench isolation material within semiconductor material elevationally inward of opposing sides of a semiconductor material channel region lengthwise of the channel region, the trench isolation material that is elevationally inward of each of the opposing sides being formed to comprise a lower trench stem and a pair of upper transverse projections that project transversely relative to the lower trench stem, opposing sides of the semiconductor material being exposed lengthwise laterally outward of the channel region;
    removing some of the semiconductor material that is laterally outward of the channel region lengthwise along the channel region and forming a channel fin with remaining of the semiconductor material; and
    forming a gate over a top and opposing sides of the fin lengthwise along the channel region.

2. The method of claim 1 wherein the semiconductor substrate comprises bulk monocrystalline silicon.

3. The method of claim 1 wherein the semiconductor substrate comprises a semiconductor-on-insulator substrate.

4. The method of claim 1 wherein forming the trench isolation material comprises forming the upper transverse projections to have outer surfaces which are convexly curved relative to fin thickness transverse the channel region.

5. The method of claim 1 wherein the semiconductor material lengthwise along the channel region has a top, the top being masked during the removing of semiconductor material that is laterally outward of the channel region.

6. The method of claim 1 wherein the semiconductor material lengthwise along the channel region has a top, the top being unmasked during the removing of semiconductor material that is laterally outward of the channel region, and further comprising removing semiconductor material from the top during the removing of semiconductor material that is laterally outward of the channel region.

7. The method of claim 6 wherein the removing semiconductor material from the top forms the channel region to comprising a rounded top lengthwise.

8. The method of claim 1 comprising providing the trench isolation material within one of each of the pairs of upper transverse projections to be at least partially under the channel fin.

9. The method of claim 1 comprising providing none of the trench isolation material within each of the pairs of upper transverse projections to be under the channel fin.

10. The method of claim 1 comprising forming the lower trench stems to have sidewalls that taper transversely inward.

11. A method of forming a field effect transistor, comprising:
    etching a pair of trenches within a semiconductor substrate on opposing sides of a semiconductor material channel region along a length of the channel region;
    etching the semiconductor material bases to form a bulbous lower portion of each trench, each of the bulbous lower portions comprising projections extending laterally outward relative to sidewalls of the trench, a projection of each bulbous lower portion opposing and extending toward a projection of the other bulbous lower portion;

etching through floors of the bulbous lower portions to extend the pair of trenches deeper within the semiconductor substrate;

after extending the pair of trenches, filling remaining volume of the trenches with insulative material;

after said filling, etching the insulative material to expose opposing sides of the semiconductor material along the channel length;

etching the exposed opposing sides of the semiconductor material along the channel length forming an upwardly projecting channel fin; and forming a gate over a top and opposing sides of the fin along the channel length.

12. The method of claim 11 comprising providing the insulative material within each of the opposing projections to be at least partially received under the upwardly projecting channel fin.

13. The method of claim 11 comprising providing none of the insulative material within each of the opposing projections to be received under the upwardly projecting channel fin.

14. A plurality of field effect transistors wherein individual of the field effect transistors of the plurality comprise:
a bulk semiconductor substrate comprising a pair of source/drain regions having a fin channel region received therebetween; the fin channel region comprising a channel length extending between the pair of source/drain regions, opposing channel sides extending along the length of the channel region, and a top extending along the length of the channel region;
a gate received over the fin channel top and the fin channel sides along the channel length; and
trench isolation received within the bulk semiconductor substrate elevationally lower than the fin channel region and beneath the gate, said trench isolation extending along the opposing channel sides along the channel length, the trench isolation in cross section transverse the channel length comprising a lower trench stem and upper transverse projections, the upper transverse projections extending from the stem transversally towards and elevationally lower than the fin channel and the gate.

15. The transistors of claim 14 wherein the lower trench stem has sidewalls that taper transversely inward.

16. DRAM circuitry comprising a plurality of individual memory cells wherein individual of the memory cells comprise a field effect transistor having a pair of source/drain regions, a capacitor connected with one of the source/drain regions, and a bit line contact connected with another of the source/drain regions, the field effect transistor comprising:
a semiconductor substrate comprising the pair of source/drain regions and having a fin channel region received between the pair of source/drain regions; the fin channel region comprising a channel length extending between the pair of source/drain regions, opposing channel sides extending along the length of the channel region, and a top extending along the length of the channel region; the fin channel region having a maximum thickness transverse the channel length;
a gate received over the fin channel top and the fin channel sides along the channel length; and
insulative material received immediately beneath the fin channel region and beneath the gate, such insulative material beneath the fin channel region and beneath the gate extending along the channel length and extending only partially across the fin channel maximum thickness transverse the channel length, such insulative material beneath the fin channel region and beneath the gate including opposing portions projecting inwardly toward one another beneath the fin channel region relative to the fin channel region maximum thickness and beneath the gate along the channel length.

17. The DRAM circuitry of claim 16 wherein the lower trench stem has sidewalls that taper transversely inward.

18. DRAM circuitry comprising a plurality of individual memory cells wherein individual of the memory cells comprise a field effect transistor having a pair of source/drain regions, a capacitor connected with one of the source/drain regions, and a bit line contact connected with another of the source/drain regions, the field effect transistor comprising:
a bulk semiconductor substrate comprising the pair of source/drain regions and having a fin channel region received between the source/drain regions; the fin channel region comprising a channel length extending between the pair of source/drain regions, opposing channel sides extending along the length of the channel region, and a top extending along the length of the channel region;
a gate received over the fin channel top and the fin channel sides along the channel length; and
trench isolation received within the bulk semiconductor substrate elevationally lower than the fin channel region and beneath the gate, said trench isolation extending along the opposing channel sides along the channel length, the trench isolation in cross section transverse the channel length comprising a lower trench stem and upper transverse projections, the upper transverse projections extending from the stem transversally towards and elevationally lower than the fin channel and the gate.

19. The DRAM circuitry of claim 18 wherein the lower trench stem has sidewalls that taper transversely inward.

* * * * *